(12) United States Patent
Lai et al.

(10) Patent No.: US 7,726,953 B2
(45) Date of Patent: Jun. 1, 2010

(54) PUMP RING

(75) Inventors: Jian-Shing Lai, Kaohsiung Hsien (TW); Ying-Yi Chang, Chiayi County (TW)

(73) Assignee: United Microelectronics Corp., Hsinchu (TW)

( * ) Notice: Subject to any disclaimer, the term of this patent is extended or adjusted under 35 U.S.C. 154(b) by 996 days.

(21) Appl. No.: 11/162,122

(22) Filed: Aug. 30, 2005

(65) Prior Publication Data

US 2007/0051309 A1   Mar. 8, 2007

(51) Int. Cl.
*C23C 16/00* (2006.01)
(52) U.S. Cl. .................. 417/313; 118/715; 156/345.29
(58) Field of Classification Search ................. 417/296, 417/423.4; 118/715–733; 156/345.24–345.55
See application file for complete search history.

(56) References Cited

U.S. PATENT DOCUMENTS

| | | | |
|---|---|---|---|
| 5,318,632 A * | 6/1994 | Onodera ..................... | 118/715 |
| 5,750,436 A * | 5/1998 | Yamaga et al. .............. | 438/558 |
| 6,156,151 A * | 12/2000 | Komino et al. .......... | 156/345.29 |
| 6,374,770 B1 * | 4/2002 | Lee et al. .................. | 118/723 E |
| 6,590,186 B2 * | 7/2003 | Tanaka et al. ............... | 219/390 |
| 6,772,827 B2 * | 8/2004 | Keller et al. ................... | 165/53 |

FOREIGN PATENT DOCUMENTS

TW    I226081    1/2005

* cited by examiner

*Primary Examiner*—Charles G Freay
*Assistant Examiner*—Christopher Bobish
(74) *Attorney, Agent, or Firm*—Jianq Chyun IP Office

(57) ABSTRACT

A pump ring. The pump ring is suitable for a reaction chamber and capable for extracting gas from the reaction chamber in a uniform gas flow rate. The pump ring comprises a ring body and a top ring part located on the ring body. The top ring part is apart from an inner wall of the reaction chamber with a fixed distance. Therefore, a gas-extraction path composed of the reaction chamber, the ring body and the top ring part is unobstructed. Hence, the turbulence flow of the extracted gas can be efficiently suppressed and the problems of the accumulation of the impurities and reaction chamber contamination can be solved.

6 Claims, 5 Drawing Sheets

PUMP RING

BACKGROUND OF THE INVENTION

1. Field of Invention

The present invention relates to a device for a semiconductor process. More particularly, the present invention relates to a pump ring.

2. Description of Related Art

Chemical Vapor Deposition (CVD) process is a thin film deposition technology for depositing solid product, which is produced from the reactants (usually is gaseous) in the reaction chamber (such as furnace) through the chemical reaction, on the surface of the wafer. CVD process can be widely applied to most kinds of the formation of the thin film such as conductive thin film, semiconductive thin film or dielectric thin film.

However, as for CVD process, the formation of the solid product from the gaseous reactants usually accompanies with producing large number of reactant particles and byproducts. Hence, it is necessary to use air-extracting device to extract the gas from the reaction chamber.

FIG. 1A is a schematic view diagram showing a pump port and a reaction chamber of a conventional CVD apparatus. The CVD apparatus is a sub-Atmosphere Chemical Vapor Deposition (SACVD) apparatus. In addition, FIG. 1B is a cross-sectional view of FIG. 1A along line I-I'. As shown in FIG. 1A and FIG. 1B, one side of a reaction chamber 10 possesses a pump port 12. A pump (not shown) is connected to the reaction chamber 10 through the pump port 12. While the CVD process is performed in the reaction chamber 10, the pump extracts the reactant particles and byproducts from the reaction chamber 10. Moreover, a pump ring 14 is located in the reaction chamber 10, wherein the periphery of the pump ring 14 and the inner wall 11 of the reaction chamber 10 together form a gas-extraction path 18. During the gas extraction, the gas extracted from the inner region 20 of the pump ring 14 by the pump through the gas-extraction path 18 and the pump port 12.

Nevertheless, typically, there is a protrusion 22 located at each side of the pump port 12 at the inner wall 11 of the reaction chamber 10. Therefore, gas-extraction path 18 is shrunk between the protrusion 22 and the pump ring 14. That is, the width d11 of the gas-extraction path 18 is decreased to be the width d12 between the protrusion 22 and the pump ring 14 so that the flow rate of the gas extracted from the inner region 20 of the pump ring 14 is changed to cause the turbulence flow between the protrusion 22 and the pump ring 14. Therefore, the particles are accumulated on the protrusion 22 (that is the accumulation 24 shown in FIG. 1A) so that the reaction chamber 10 is contaminated and the problems of apparatus malfunction and damage of the semi-finished product happened.

SUMMARY OF THE INVENTION

Accordingly, at least one objective of the present invention is to provide a pump ring. By using the pump ring, the gas is evenly extracted from the reaction chamber and the turbulence flow is suppressed during the gas extraction procedure. Further, the contamination of the reaction chamber caused by the accumulation of the impurities is decreased.

To achieve these and other advantages and in accordance with the purpose of the invention, as embodied and broadly described herein, the invention provides a pump ring for a reaction chamber. The pump ring comprises a ring body and a top ring part. The top ring part is located on the ring body and the top ring part is apart from an inner wall of the reaction chamber with a distance.

In the present invention, the ring body is adjacent to the inner wall of the reaction chamber and the top ring part and the ring body are integrated with each other. In addition, the top ring part and the ring body are coaxial and a radius of an outer periphery of the top ring part is smaller than a radius of an outer periphery of the ring body.

The present invention also provides a pump ring for a reaction chamber, wherein an inner wall of the reaction chamber possesses a plurality of protrusions. The pump ring comprises a ring body and a top ring part. The top ring part is located on the ring body, wherein a plurality of recessions are located on the top ring part so that the top ring part is apart from the protrusions on the inner wall of the reaction chamber with a distance.

In the present invention, the ring body is adjacent to the inner wall of the reaction chamber and the top ring part and the ring body are integrated with each other.

The present invention further provides a pump ring for a reaction chamber, wherein an inner wall of the reaction chamber possesses a plurality of protrusions. The pump ring comprises a ring body and a top ring part located on the ring body. The top ring part and the ring body are coaxial and a first radius of an outer periphery of the top ring part is smaller than a second radius of an outer periphery of the ring body so that the top ring part is apart from the protrusions on the inner wall of the reaction chamber with a distance.

In the present invention, the ring body is adjacent to the inner wall of the reaction chamber. Moreover, the top ring and the ring body are integrated with each other. The pump ring of the present invention is apart from the reaction chamber with a distance so that the turbulence flow can be efficiently suppressed and the laminar flow window is increased. Hence, the accumulation of the impurities is decreased and the reaction chamber contamination problem can be solved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
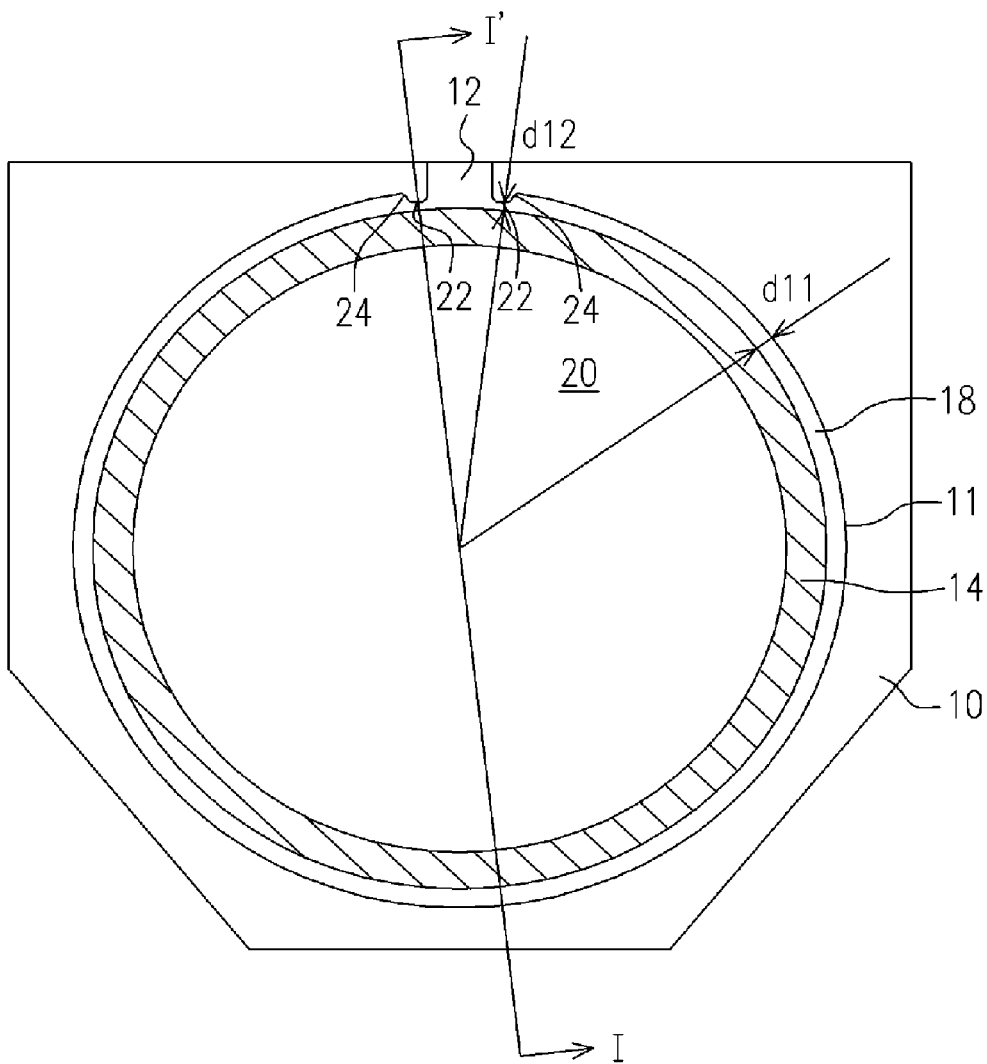
FIG. 1A is a schematic view diagram showing a pump port and a reaction chamber of a conventional CVD apparatus.
Figure 1B:
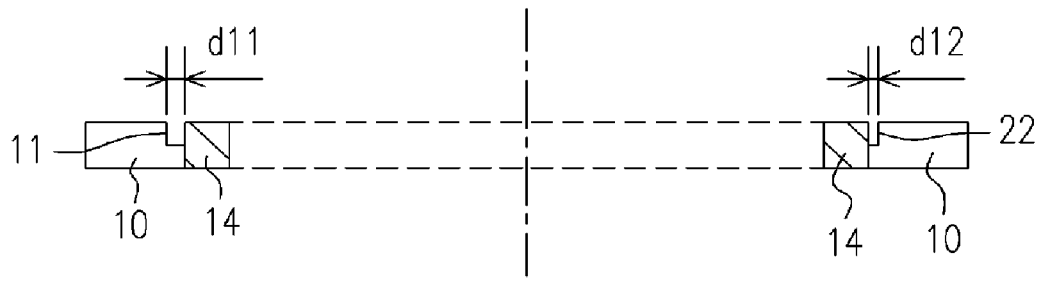
FIG. 1B is a cross-sectional view of FIG. 1A along line I-I'.
Figure 2A:
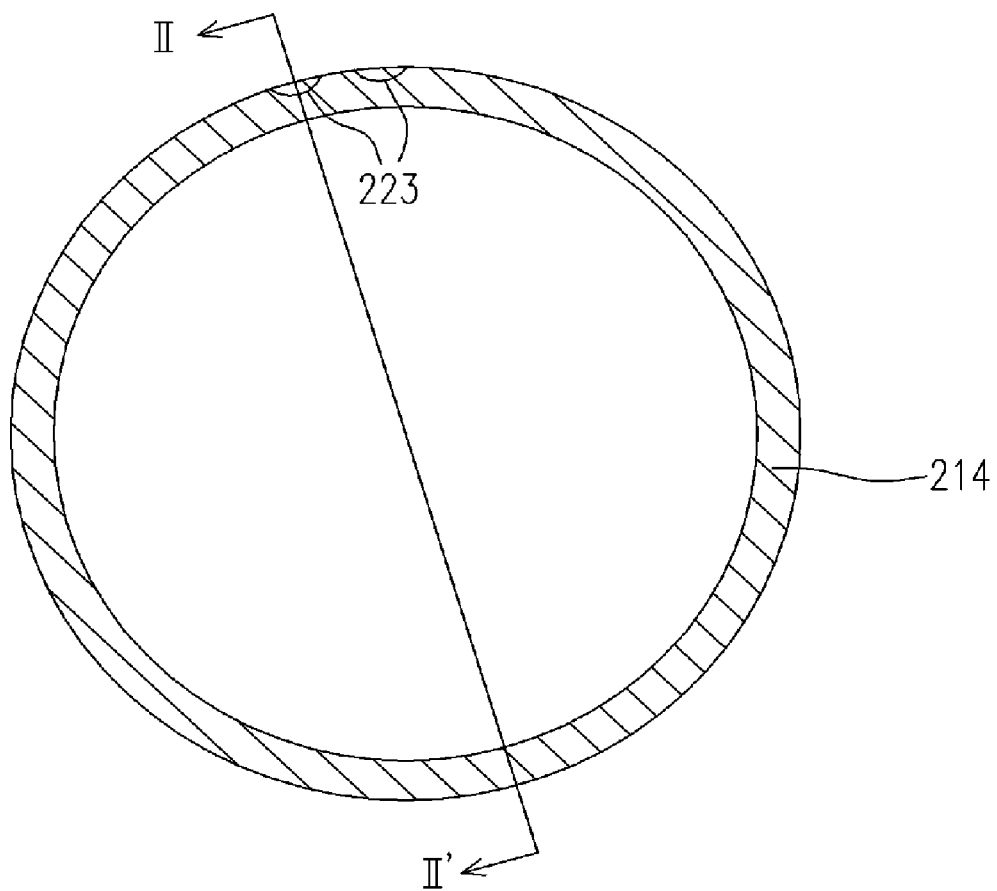
FIG. 2A is a schematic top view diagram of a pump ring of one of the preferred embodiment according to the present invention.
Figure 2B:
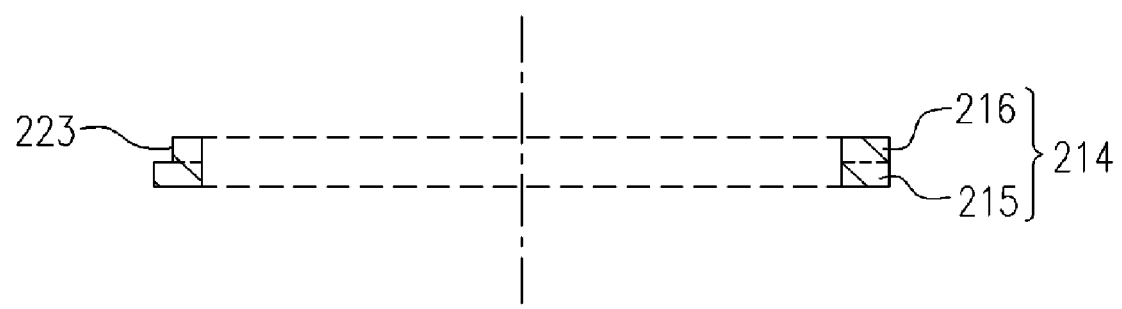
FIG. 2B is a cross-sectional view of FIG. 2A along line II-II'.
Figure 2C:
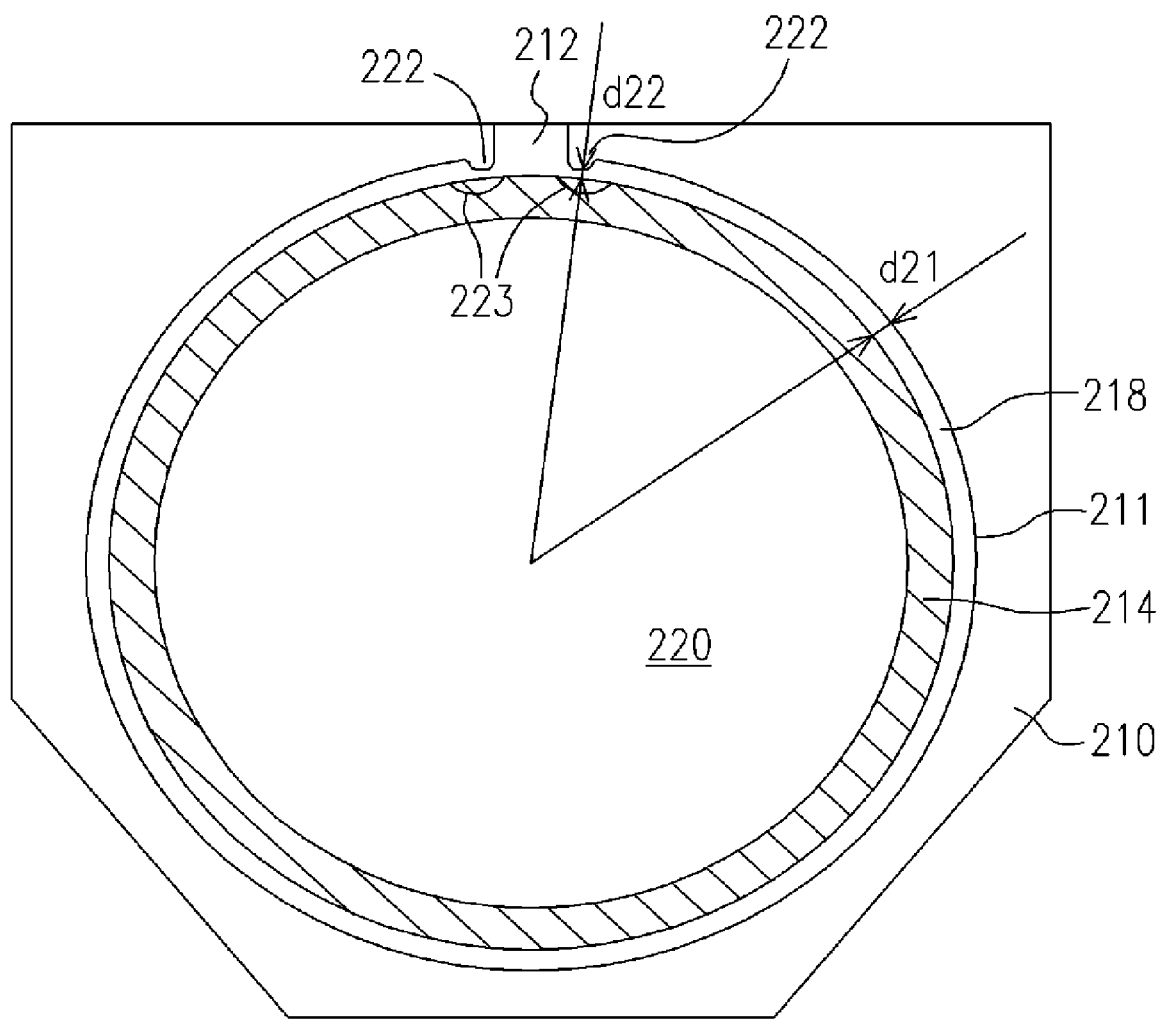
FIG. 2C is a schematic top view diagram illustrating a reaction chamber and the pump ring shown in FIG. 2A of one of the preferred embodiment according to the present invention.

FIG. 2A is a schematic top view diagram of a pump ring of one of the preferred embodiment according to the present invention. FIG. 2B is a cross-sectional view of FIG. 2A along line II-II'. FIG. 2C is a schematic top view diagram illustrating a reaction chamber and the pump ring shown in FIG. 2A of one of the preferred embodiment according to the present invention. Referring to FIG. 2A together with FIG. 2B and FIG. 2C, a pump port 212 is located in a reaction chamber 210. Furthermore, there are several protrusions 222 located on the inner wall 211 of the reaction chamber 210 around the pump port 212 and a pump ring 214 is located in the reaction chamber 210.

The pump ring 214 comprises a ring body 215 and a top ring part 216 located on the ring body 215. The top ring part 216 includes several recessions 223. After the pump ring 214 is disposed in the reaction chamber 210, the ring body 215 is adjacent to the inner wall 211 of the reaction chamber 210 and the top ring part 216 and the inner wall 211 of the reaction chamber 210 together form a gas-extraction path 218. That is, gas can flow between the inner region 220 of the pump ring 214, the gas-extraction path 218 and the pump port 212. In addition, the recessions 223 of the top ring part 216 are located one-by-one correspondingly to the protrusions 222 on the inner wall 211 of the reaction chamber 210. Therefore, the width d22 of a portion of the gas-extraction path 218 around the protrusions 222 is approximately equal to the width d21 of the gas-extraction path 218 other than the portion around the protrusions 222. Hence, the width of the gas-extraction path 218 is uniform so that the turbulence flow caused by uneven path width can be suppressed.

Figure 2D:
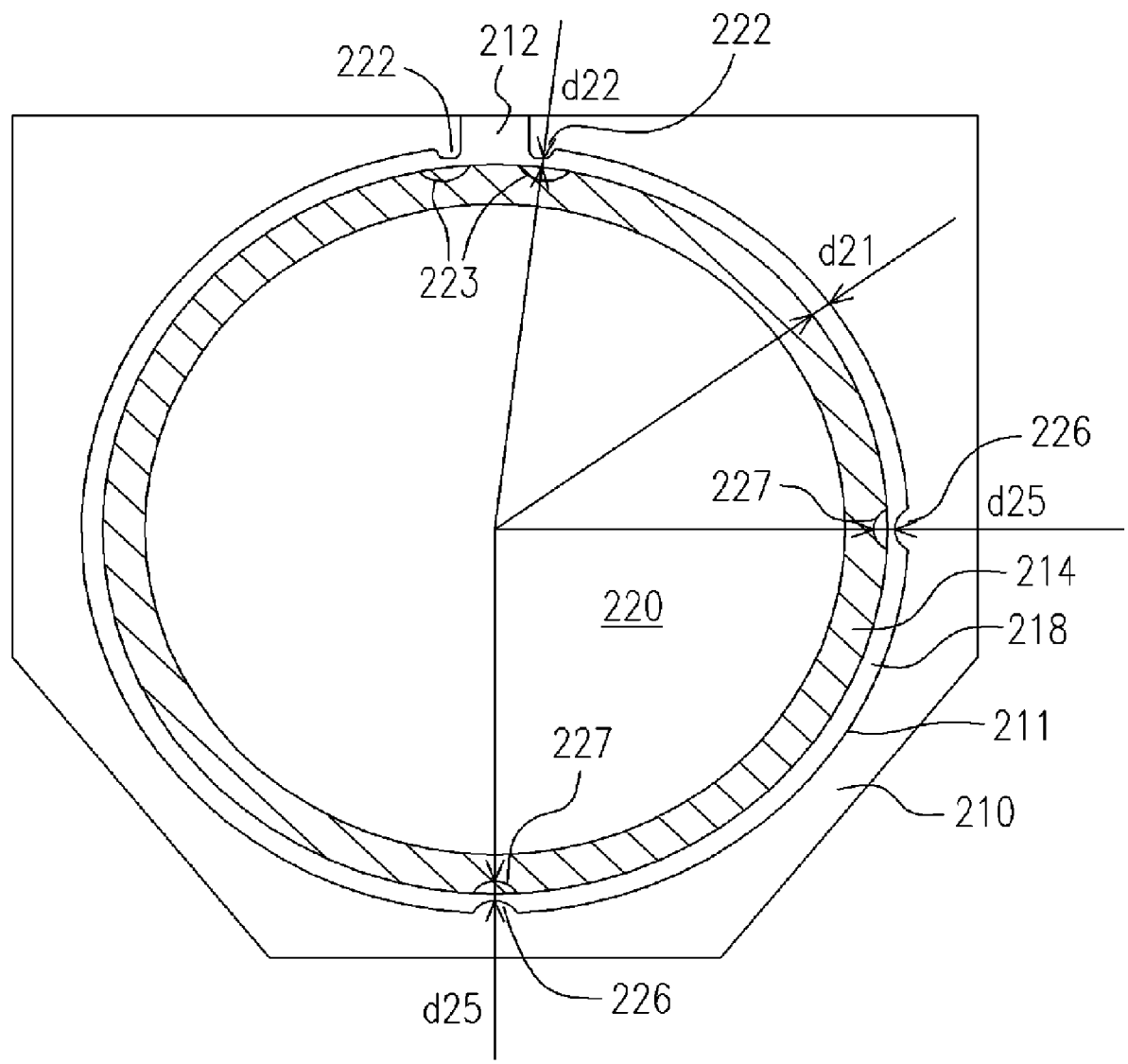
FIG. 2D is a schematic top view diagram illustrating another reaction chamber and another pump ring of another preferred embodiment according to the present invention.

FIG. 2D is a schematic top view diagram illustrating another reaction chamber and another pump ring of another preferred embodiment according to the present invention. As shown in FIG. 2D, there are protrusions 226, other than the protrusions 222, on the inner wall 211 of the reaction chamber 210. In order to avoid the gas-extraction path 218 from being shrunk because of the protrusions 226, the top ring part 216 possesses several recessions 217 located one-by-one correspondingly to the location of the protrusions 226. Hence, the width d25 of a portion of the gas-extraction path 218 around the protrusions 226 is approximately equal to the width d21 of the gas-extraction path 218 other than the portion around the protrusions 226. That is, the width of the gas-extraction path 218 is uniform so that the turbulence flow caused by uneven path width can be suppressed.

Comparing with the reaction chamber 210 shown in FIG. 2C, there exist extra protrusions 226 on the inner wall 211 of the reaction chamber 210 shown in FIG. 2D. The top ring part 216 shown in FIG. 2D further comprises recessions 227 located one-to-one correspondingly to the protrusions 226. The width d25 of the gas-extraction path 218 between the protrusion 226 and the recession 227 is approximately equal to the width d21 between the top ring part 216 and the inner wall 211 of the reaction chamber 210. That is, the width of the gas-extraction path 218 is uniform so that the turbulence flow caused by uneven path width can be suppressed.

Notably, in the reaction chamber 210, the pump ring 214 described in each embodiment above is apart from the inner wall 211 of the reaction chamber 210 with a fixed distance (a fixed path width). That is, the gas-extraction path 218 composed of the top ring part 216 and the inner wall 211 of the reaction chamber 210 possesses a fixed path width. Therefore, the turbulence flow of the extracted gas caused by uneven path width can be suppressed.

Figure 3:
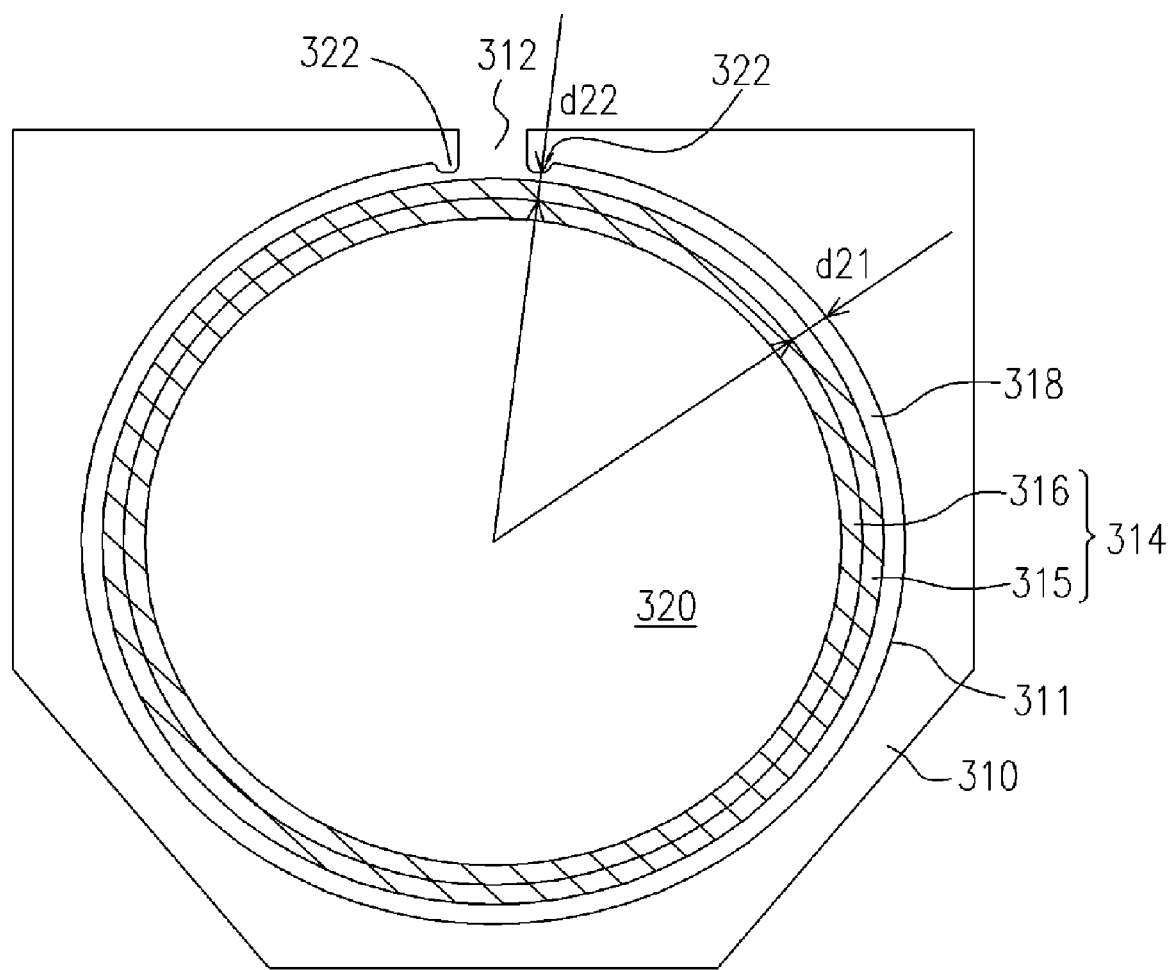
FIG. 3 is a schematic top view diagram illustrating the other reaction chamber and the other pump ring of the other preferred embodiment according to the present invention.

FIG. 3 is a schematic top view diagram illustrating the other reaction chamber and the other pump ring of the other preferred embodiment according to the present invention. As shown in FIG. 3, a pump port 312 is located in a reaction chamber 310 and a pump ring 314 is located in the reaction chamber 310.

The pump ring 314 comprises a ring body 315 and a top ring part 316 placed on the ring body 315. After the pump ring 314 is placed in the reaction chamber 310, the ring body 315 of the pump ring 314 is adjacent to the inner wall 311 of the reaction chamber 310. Furthermore, the top ring part 316 and the inner wall 311 of the reaction chamber 310 together form a gas-extraction path 318. That is, gas can flow between the inner region 320 of the pump ring 314, the gas-extraction path 318 and the pump port 312. In addition, the width d21 of the gas extraction path 318 is fixed. That is, the distance between the outer periphery of the top ring part 316 and the inner wall 311 of the reaction chamber 310 is fixed to be d21. Moreover, there exist protrusions 322 at the inner wall 311 of the reaction chamber 310 around the pump port 312 and the width of the gas-extraction path 318 around the protrusions 322 is labeled as d22.

The reaction chamber 310 mentioned above can be, for example but not limited to, SACVD apparatus. The remaining gas after the CVD process is performed is extracted from the inner region 320 of the pump ring 314 in the reaction chamber 310 by pump through the gas-extraction path 318 and the pump port 312.

Since the width of the gas-extraction path 318 is decreased around the protrusions 322, the turbulence flow of the extracted gas caused by the changing of the gas flow rate happens. In order to suppress the turbulence flow of the extracted gas, the width d21 can be properly designed to alleviate the turbulence flow happening around the protrusions 322. In one preferred embodiment, top ring part 316 and the ring body 315 can be, for example but not limited to, integrated with each other to simplify the manufacturing process of forming the pump ring 314. Furthermore, the top ring 316 and the ring body 315 are designed to be coaxial to simplify the manufacturing process of forming the pump ring 314. Basically, a radius of an outer periphery of the top ring part 316 is smaller than a radius of an outer periphery of the ring body 315.

As shown in FIG. 3, the radius of the outer periphery of the top ring part 316 is fixed and smaller than the radius of the outer periphery of the ring body 315. Hence, the gas extracted from the inner region 320 of the pump ring 314 can be flowing in relatively wide gas-extraction path 318. Accordingly, the difference between the width d21 and the width d22 around the protrusions 322 is relatively small even can be neglected by comparing to the relatively wide width d21. Hence, the turbulence flow of the extracted gas happening around the protrusions 322 can be efficiently alleviated.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A pump ring for a reaction chamber, wherein an inner wall of the reaction chamber possesses a plurality of protrusions, the pump ring comprising:
   a ring-shaped body disposed in the reaction chamber; and
   a top ring-shaped part located on the ring-shaped body,
      wherein a outer peripheral sidewall of the top ring-shaped part is opposite to the inner wall of the reaction chamber, and a plurality of recessions are located on the outer peripheral sidewall of the top ring-shaped part without penetrating through the top ring-shaped part and the recessions are configured to be opposite to the protrusions on the inner wall of the reaction chamber respectively and a protrudent profile of each of the protrusions is conformal to a concave profile of the corresponding recession so that the top ring-shaped part is apart from the protrusions on the inner wall of the reaction chamber with a distance.

2. The pump ring of claim 1, wherein the ring-shaped body is adjacent to the inner wall of the reaction chamber.

3. The pump ring of claim 1, wherein the top ring-shaped part and the ring-shaped body are integrated with each other.

4. The pump ring of claim 1, wherein the reaction chamber comprises a pump port and the plurality of the recessions is configured on the top ring-shaped part at a side of the pump port.

5. The pump ring of claim 1, wherein the reaction chamber comprises a pump port and a portion of the plurality of the recessions is configured on the top ring part at a side of the pump port, and a remaining portion of the plurality of the protrusions is configured on the top ring part asides from the side of the pump port.

6. The pump ring of claim 1, wherein the plurality of recessions is configured to form a continuous recessed ring such that the top ring part and the ring body are coaxial and a first radius of an outer periphery of the top ring part is smaller than a second radius of an outer periphery of the ring body.

* * * * *